United States Patent
Ciraula et al.

[11] Patent Number: 6,094,071
[45] Date of Patent: Jul. 25, 2000

[54] INITIALIZATION OF FLOATING BODY DYNAMIC CIRCUITRY

[75] Inventors: Michael Kevin Ciraula, Round Rock; Visweswara Rao Kodali, Austin, both of Tex.

[73] Assignee: International Business Machines Corporation, Armonk, N.Y.

[21] Appl. No.: 09/270,188

[22] Filed: Mar. 15, 1999

[51] Int. Cl.[7] ................................................ H03K 19/096
[52] U.S. Cl. ................................ 326/97; 326/98; 326/121
[58] Field of Search ......................... 326/93, 121, 95–98, 326/112, 119, 26–27; 327/534

[56] References Cited

U.S. PATENT DOCUMENTS

| | | | |
|---|---|---|---|
| 4,137,563 | 1/1979 | Tsunoda | 364/200 |
| 4,686,386 | 8/1987 | Tadao . | |
| 4,888,631 | 12/1989 | Azuma et al. | 357/23.6 |
| 5,099,140 | 3/1992 | Mudgett . | |
| 5,250,852 | 10/1993 | Ovens et al. | 326/95 |
| 5,363,325 | 11/1994 | Sunouchi et al. | 365/149 |
| 5,587,672 | 12/1996 | Ranganathan et al. | 326/97 |

*Primary Examiner*—Jon Santamauro
*Attorney, Agent, or Firm*—Casimer K. Salys; Felsman, Bradley, Vaden, Gunter & Dillon, LLP

[57] ABSTRACT

A system and method for initializing a threshold voltage level of a dynamic circuit prior to a transition of said dynamic circuit from a passive mode to an active mode. A dynamic logic circuit has a runtime operation that alternates between an active and a passive mode and includes at least one transistor having a floating body and a threshold voltage level. A switching device within the dynamic logic circuit forms a means from which the floating body draws an electric charge during the passive mode, thereby altering the threshold voltage level. The switching device receives a clock input signal during the dynamic circuit's active mode. Input selection means selectively replace the clock input signal with a pre-clock input signal into the switching device for a pre-determined period of time prior to a transition by the dynamic logic circuit from the passive mode to the active mode, such that the floating body may adequately discharge, thereby initializing the threshold voltage level prior to commencement of the active mode.

13 Claims, 4 Drawing Sheets

INITIALIZATION OF FLOATING BODY DYNAMIC CIRCUITRY

BACKGROUND OF THE INVENTION

1. Technical Field

The present invention relates in general to dynamic logic circuitry, and in particular to a method and system for initializing the threshold voltage of a transistor within a dynamic circuit during a transition from a passive to an active mode of operation. Still more particularly, the present invention relates to a method and system for discharging Silicon On Insulator (SOI) Metal Oxide Semiconductor Field Effect Transistor (MOSFET) body voltages to prevent MOSFET switching thresholds from becoming unacceptably low, thereby preventing the dynamic circuit from being unduly susceptible to noise upon initialization from a passive mode of operation.

2. Description of the Related Art

Complementary Metal Oxide Semiconductor (CMOS) gate circuits are known in the art. A conventional dynamic CMOS gate 100 is illustrated in FIG. 1A. Dynamic CMOS gate 100 consists of an N-type transistor logic structure 105 whose output node 102 is pre-charged to $V_{dd}$ 112 by a P-type transistor 104 and conditionally discharged by an N-type transistor 106 connected to $V_{ss}$ 110. A clock input 108 provides a single phase clock signal to P-type transistor 104 and N-type transistor 106. Consistent with standard dynamic logic principles, a "pre-charge" phase occurs within dynamic CMOS gate 100 when clock input 108 is at logic "0". During the pre-charge phase, the path to $V_{ss}$ 110 is open via N-type transistor 106. Alternating with the pre-charge phase, is the "evaluate" phase, during which the path to $V_{ss}$ 110 is closed via N-type transistor 106 when clock input 108 is at a logic "1". N-type transistor 106 therefore serves as a pull-down switch and is commonly referred to in the art as a "footed switch" or alternatively as a "ground switch". In the interest of clarity, a transistor that is configured within a dynamic circuit analogously to N-type transistor 106 will be referred to hereinafter as the "ground switch".

Referring now to FIG. 1B, a block diagram of a conventional row of domino logic circuitry is depicted. As illustrated, row 150 includes two domino logic circuits 152 and 154, which may implement the same or different logic functions. A problem arises however, when either or both clock inputs C1 164 and C2 162 into dynamic circuits 154 and 152 and input/output latches 156, 158, and 160, are temporarily disabled or held at a logical 0 for a prolonged period of time. Referring again to FIG. 1A, when clock input 108 is inactive for a relatively long period, the bodies of transistors within logic structure 105 become charged due to leakage currents. As a result, the threshold voltage (commonly known as the "switching threshold") of such charged devices drop to an unacceptably low level, thereby causing these devices to be unduly susceptible to noise.

It would therefore be desirable to be able to control the body voltage of transistors within a dynamic circuit in order to stabilize the switching thresholds of the transistors. Further, it would be desirable to apply a pre-charge input signal into a grounding switch within a dynamic logic circuit prior to the dynamic circuit being activated from a passive mode of operation, such that the threshold voltage levels within the dynamic circuit may be properly initialized.

SUMMARY OF THE INVENTION

It is therefore one object of the present invention to provide an improved dynamic logic circuit.

It is another object of the present invention to provide a method and system for initializing the threshold voltage of a transistor within a dynamic circuit during a transition from a passive to an active mode of operation.

It is yet another object of the present invention to provide a method and system for discharging Metal Oxide Semiconductor Field Effect Transistor (MOSFET) body voltages to prevent MOSFET switching thresholds from becoming unacceptably low, thereby preventing the dynamic circuit from being unduly susceptible to noise upon initialization from a passive mode of operation.

The foregoing objects are achieved as is now described. A system and method are disclosed for initializing a threshold voltage level of a dynamic circuit prior to a transition of said dynamic circuit from a passive mode to an active mode. A dynamic logic circuit has a runtime operation that alternates between an active and a passive mode and includes at least one transistor having a floating body and a threshold voltage level. A ground switching device within the dynamic logic circuit forms a means from which the floating body draws an electric charge during the passive mode, thereby altering the threshold voltage level. The ground switching device receives a clock input signal during the dynamic circuit's active mode. Input selection means selectively replace the clock input signal with a pre-clock input signal into the ground switching device for a pre-determined period of time prior to a transition by the dynamic logic circuit from the passive mode to the active mode, such that the floating body discharges prior to commencement of the active mode, thereby initializing the threshold voltage level prior to commencement of the active mode.

The above as well as additional objects, features, and advantages of the present invention will become apparent in the following detailed written description.

BRIEF DESCRIPTION OF THE DRAWINGS

The novel features believed characteristic of the invention are set forth in the appended claims. The invention itself however, as well as a preferred mode of use, further objects and advantages thereof, will best be understood by reference to the following detailed description of an illustrative embodiment when read in conjunction with the accompanying drawings, wherein:

DETAILED DESCRIPTION OF ILLUSTRATIVE EMBODIMENT

Figure 1A:
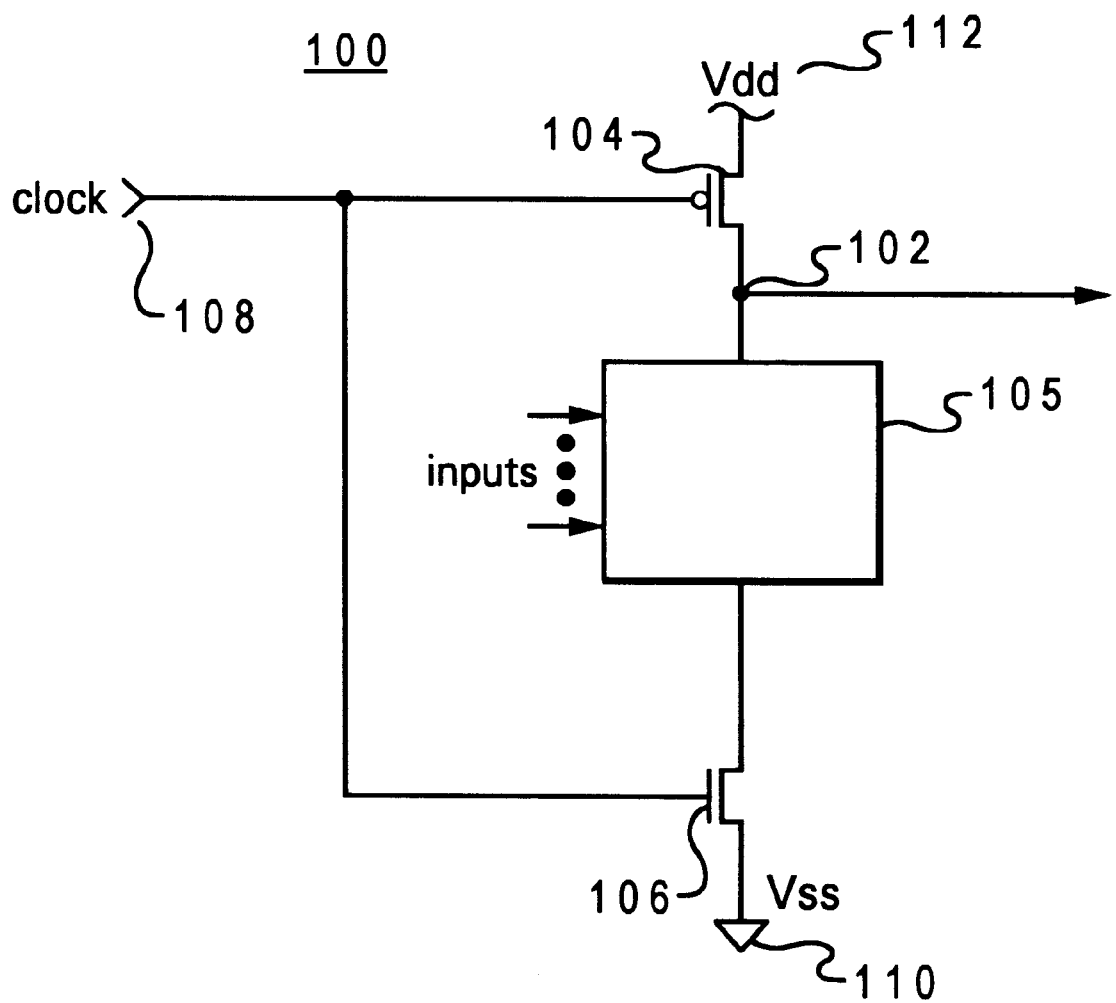
FIG. 1A depicts a simplified schematic representation of a conventional dynamic logic circuit.

Modern semiconductor fabrication processes allow MOSFETs to have switching thresholds on the order of a few hundred millivolts. The threshold voltage is a critical attribute of a circuit. Specifically, efficient operation of serially coupled dynamic logic circuits depends on maintaining stable threshold voltages.

The present invention maintains control of a threshold voltage in a manner particularly well-suited to SOI-based CMOS device design by utilizing a transistor performance characteristic known as the "body effect". Simply put, the body effect is a phenomena associated with MOSFET transistors in which the voltage differential between the source and transistor body, referred to hereinafter as body-to-source voltage, or $V_{bs}$, alters the threshold voltage of a transistor. This altered threshold voltage changes the transistor's conductivity from source to drain. Body effect is well known in the art of integrated circuit technology.

It is well known in the art of MOSFET devices, that the threshold voltage ($V_t$) (sometimes referred to as the "switching voltage" in digital applications) is a secondary function of $V_{bs}$. Therefore, as the body of a MOSFET device becomes charged, its $V_{bs}$ and, in turn its $V_t$ changes. In the case of N-type MOSFETs, the $V_t$ varies inversely with body voltage. Therefore, as charge collects within an N-type transistor body, the $V_t$ of the device decreases thus resulting in a lower switching threshold and increased susceptibility to noise.

The problem of fluctuating $V_{bs}$ and unstable switching thresholds is particularly acute in dynamic logic circuits that employ SOI technology. SOI technology is characterized by the carrier transport layer and transistor body being electrically isolated from the substrate. Therefore, in SOI implementations, transistor bodies are floating with respect to ground and power. This construction is in contrast to conventional BULK CMOS design in which transistor bodies are not insulated from the substrate and are therefore maintained at a specified reference voltage level ($V_{dd}$ or $V_{ss}$, for example).

A SOI MOSFET is manufactured by creating silicon oxide layer within a substrate material. A widely utilized substrate material is silicon. The silicon oxide layer can be created by various methods. One method is referred to by those skilled in the art as Separation by Implantation of Oxygen (SIMOX) which is utilized to fabricate SOI CMOS. In a typical SIMOX method, oxygen is implanted in a single crystal silicon wafer by a bombardment technique which controls the depth of penetration of the silicon substrate by oxygen atoms.

The present invention is particularly useful when implemented within dynamic SOI CMOS technology. However, any technology which allows bodies of transistors to be charged could be utilized with the present invention. In accordance with the present invention, transistor bodies in the dynamic logic circuit configuration are susceptible to becoming charged and when the transistor body is charged, the switching threshold of the transistor decreases. With a decrease in threshold voltage, the transistor becomes more susceptible to noise.

As is well-known to those skilled in the art, a conventional dynamic logic integrated circuit divides a clock cycle into pre-charge and evaluate phases. During the pre-charge phase, the dynamic logic circuit is preset to a known logic state, and during the evaluate phase, the logic inputs of the dynamic logic circuit are evaluated by circuitry that implements a logic function to determine a logic output.

Figure 2:
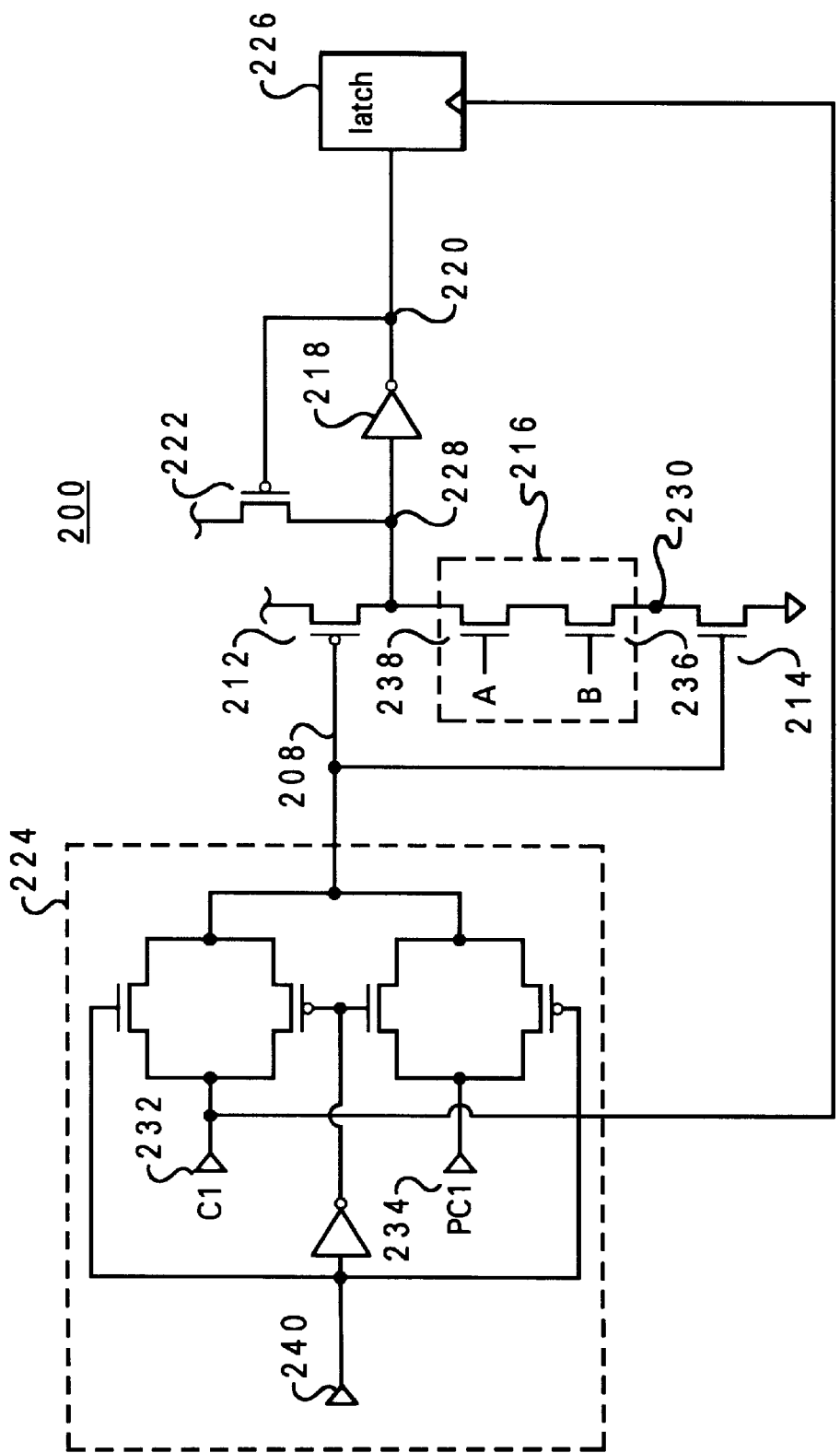
FIG. 2 depicts a schematic representation of one embodiment of a pre-charged domino dynamic logic circuit constructed in accordance with the teachings of the present invention.

With reference now to FIG. 2, there is illustrated a schematic diagram of a pre-charged dynamic logic circuit 200, implemented utilizing domino logic. Dynamic logic circuit 200 includes a pre-charge transistor 212, a discharge transistor 214, a domino logic block 216, an inverter 218, and a feedback transistor 222. As illustrated in FIG. 2, pre-charge transistor 212 is turned on and pre-charges node 228 to a logic high state during the pre-charge phase of clock input 208. Then, in response to the rising edge (i.e., evaluate phase) of clock input 208, discharge transistor 214 is turned on and discharges node 230 to a logic low state. During the evaluate phase, node 228 will either remain at a logic high state or discharge to the logic low state of node 230 depending upon the logic states of the logic inputs and the logic function implemented by domino logic block 216.

Dynamic logic circuit 200 will cycle between periods of active operation, referred to hereinafter as "active mode" and periods of inactivity marked by the absence of a regular clock signal applied to clock input 208. Periods of inactivity may be referred to as "passive mode" or "sleep mode". It is during passive mode of operation, that the floating bodies of N-type MOSFET SOI transistors 236 and 238 within domino logic block 216, may become charged from the temporarily static voltage level at node 230. In accordance with the teachings of the present invention, a clock signal to be applied to clock input 208 is selected from either clock 1 232 or pre-clock 1 234. A multiplexer 224 is utilized to selectively replace clock 1 232 with pre-clock 1 234 for a predetermined period of time prior to a transition of dynamic logic circuit 200 from a passive, or standby mode, to an active mode of operation. In this manner, the threshold voltages of SOI transistors 236 and 238 may be properly initialized prior to commencement of an active mode of operation.

A control input 240 serves as the input select line for multiplexer 224. In the configuration depicted, when control input 240 is at a logic "0", multiplexer 240 applies clock 1 232 to clock input 208. When control input 240 is at a logic "1", pre-clock 1 234 is applied as clock input signal 208. Although not depicted in FIG. 2, a suitable control device such as a counter may be utilized to switch control input 240 from logic "0" to logic "1", for a pre-determined period of time prior to a transition of dynamic logic circuit 200 from a passive mode to an active mode of operation. As seen in FIG. 2 and in an important feature of the present invention, latch 226 receives its clock input independently of the pre-charge function performed by multiplexer 224. In this manner, the present invention prevents spurious noise that may occur within dynamic logic circuit 200 during the pre-charge period, from affecting the latched output of dynamic logic circuit 200.

It should be noted that although domino logic block 216 is depicted in FIG. 2 as a two-input AND gate, it will be appreciated and understood by those skilled in the art that many other logic functions may be performed within domino logic block 216 without departing from the spirit or scope of the present invention. During both of the pre-charge and evaluate phases of clock signal 208, the logic state of node 328 is inverted by inverter 218 to obtain output signal 220, which is latched by the operation of feedback transistor 222.

Figure 3A:
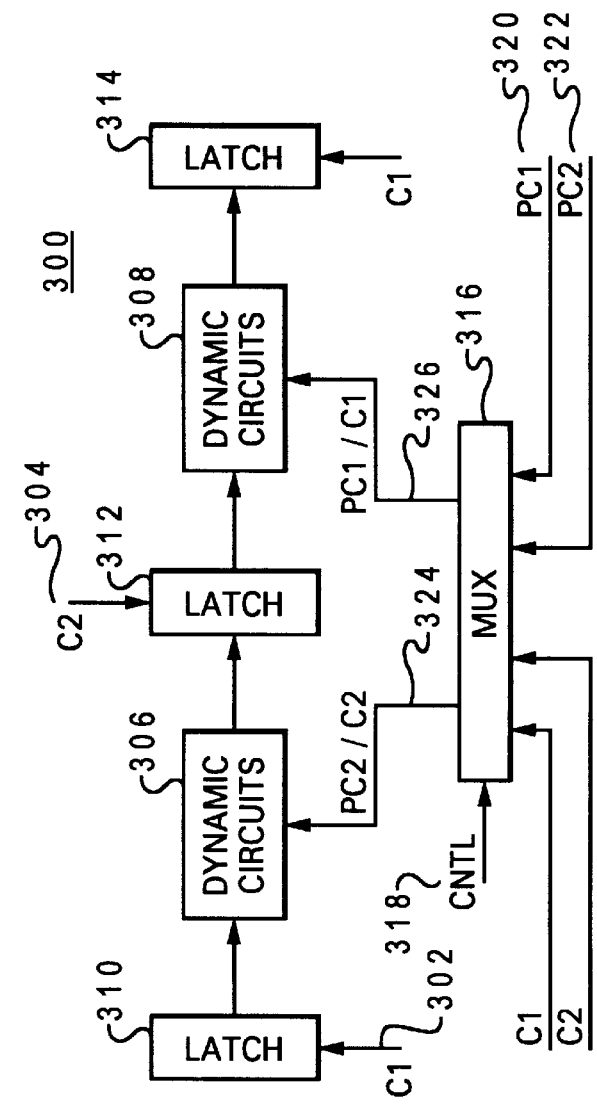
FIG. 3A illustrates a block diagram representation of a pre-charged domino dynamic logic circuit configuration in accordance with a preferred embodiment of the present invention.

With reference now to FIG. 3A, there is illustrated a block diagram representation of a pre-charged domino dynamic logic circuit configuration in accordance with a preferred embodiment of the present invention. Domino logic circuits 306 and 308, forming row 300 each receive a respective set of input signals from latch 310 and latch 312 respectively. Circuits 306 and 308 also generate and deliver output signals to latch 312 and latch 314 respectively, in response to the evaluate phase of clock signals 304 and 302. In order to implement a complex logic function, such as that performed by the arithmetic logic unit (ALU) of a processor, a series of rows, such as row 300 may be coupled together sequentially.

Figure 1B:
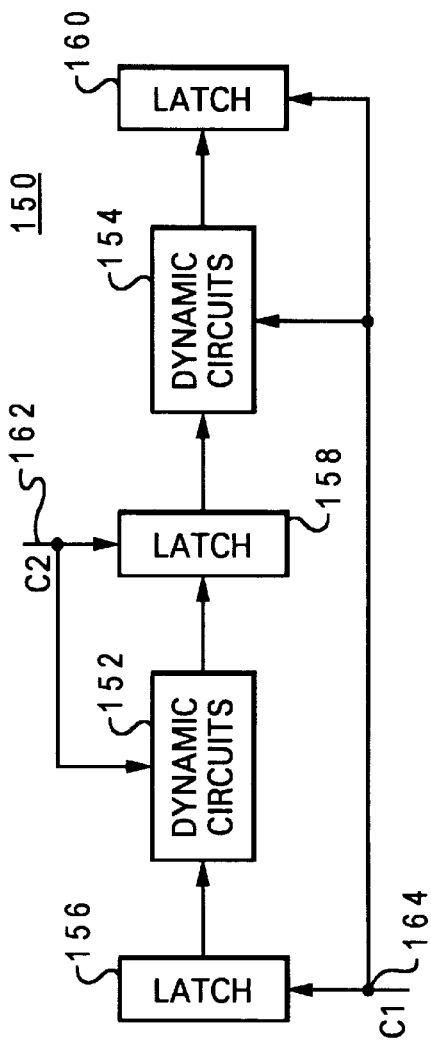
FIG. 1B illustrates a block diagram representation of the dynamic logic circuit of FIG. 1A incorporated into a two-phase dynamic circuit configuration.

As seen in FIG. 3A, a second set of clock signals, PC1 320 and PC2 322, are introduced into the conventional domino configuration described in FIG. 1B. PC1 320 and PC2 322 are selectively applied via multiplexer 316 only into dynamic circuits 308 and 306, but not into latches 310, 312 and 314. A control signal 318 is utilized to replace clock signals C1 302 and C2 304 with PC1 320 and PC2 322, respectively, and apply these pre-charge signals at the conclusion of standby or "sleep" mode of operation of row 300. Control signal 318 will maintain this precharge condition for a predetermined period of time after which clock signals C1 302 and C2 304 will be reinstated and applied throughout active operation of row 300. In this manner, pre-charge signals PC1 320 and PC2 322 are utilized to charge and discharge an internal node, such as node 230 within dynamic circuit 200, such that an accumulated body charge that may reside on floating body transistors within dynamic circuits 306 and 308 may adequately dissipate prior to resumption of active circuit operation.

Figure 3B:
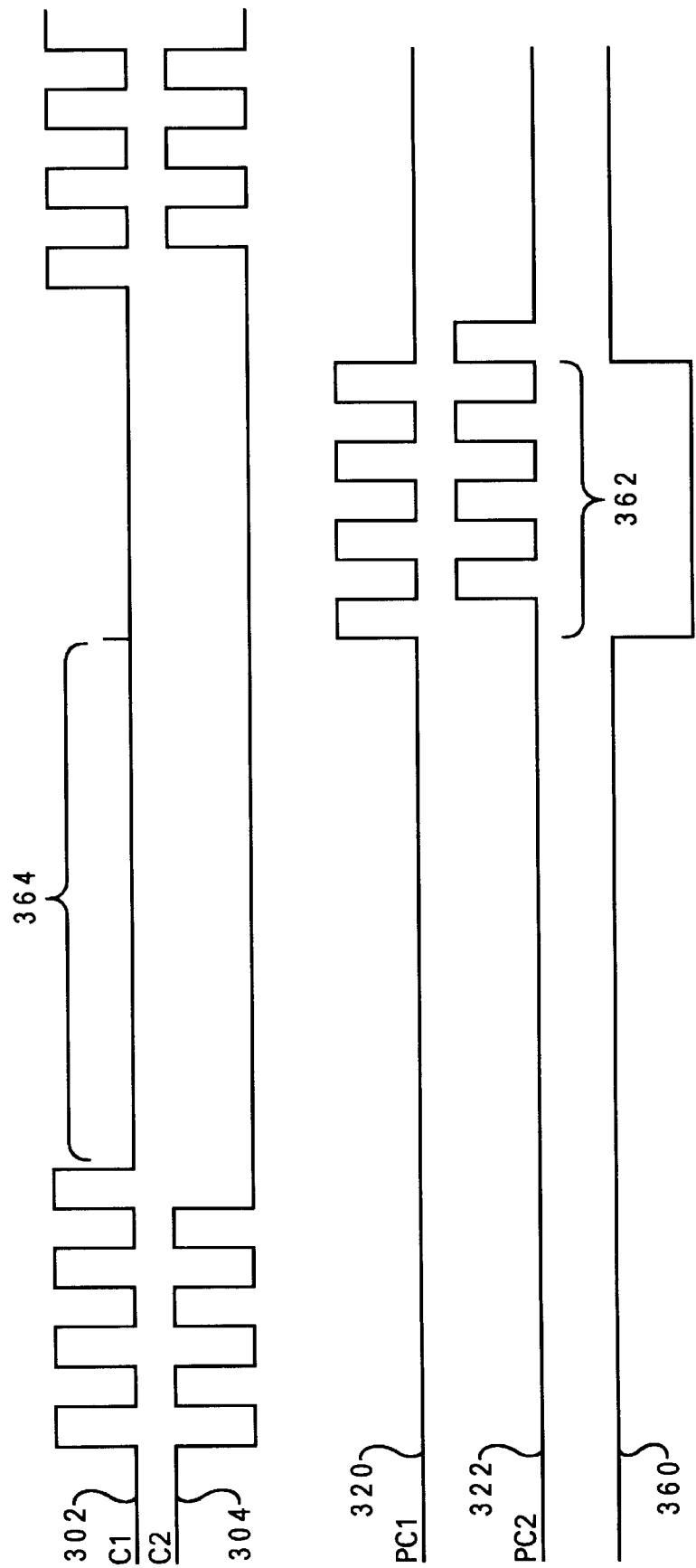
FIG. 3B is a timing diagram depicting the operation of the pre-charged domino dynamic logic circuit illustrated in FIG. 3A.

Referring now to FIG. 3B, which is an exemplary timing diagram of the operation of the pre-charging system depicted in FIG. 3A. As seen in FIG. 3B, clock signals C1 302 and C2 304 are applied by multiplexer 316 to dynamic circuits 308 and 306 respectively during an active mode of operation. During a passive or "sleep" mode of operation, C1 302 and C2 304 are both disabled and remain at a logic "0" until they are re-initialized into an active mode of operation. It is during the period of passive operation 364, that floating bodies of transistors within dynamic circuits 306 and 308 may accumulate a charge, thereby reducing their threshold switching voltages. The body charges are drawn from ground switches within dynamic circuits 306 and 308. Referring back to FIG. 2, discharge transistor 214 is an example of such a ground switch.

In accordance with the teachings of the present invention, a control signal 318 is applied to multiplexer 316, thereby enabling multiplexer 316 to selectively replace C1 302 with a pre-charge signal PC1 320 and C2 304 with pre-charge signal PC2 322. As illustrated in FIG. 3B the replacement of C1 302 and C2 304 with PC1 320 and PC2 322 occurs during a pre-charge phase 362 that may span a few clock cycles. It is during pre-charge phase 362 that floating transistor bodies within dynamic circuits 306 and 308 are permitted to adequate discharge, thereby raising their threshold voltages and restoring their resistance to noise effects.

In the illustrative embodiment, the replacement of the clock signals with the pre-charge signals occurs only at the inputs of dynamic circuits 306 and 308 and not at any of input/output latches 310, 312, or 314, all of which continue to receive signals C1 302 and C2 304.

While the invention has been particularly shown and described with reference to a preferred embodiment, it will be understood by those skilled in the art that various changes in form and detail may be made therein without departing from the spirit and scope of the invention.

What is claimed is:

1. A system for initializing a threshold voltage level of a dynamic circuit prior to a transition of said dynamic circuit from a passive mode to an active mode, said system comprising:

a dynamic logic circuit having a runtime operation that alternates between an active and a passive mode, said dynamic logic circuit including at least one transistor having a floating body and a threshold voltage level;

a switching device within said dynamic logic circuit from which said floating body draws an electric charge during said passive mode, thereby altering said threshold voltage level, said switching device receiving a clock input during said active mode; and input selection means for selectively replacing said clock input with a pre-clock input into said switching device for a pre-determined period of time prior to a transition by said dynamic logic circuit from said passive mode to said active mode, such that said floating body discharges, thereby initializing said threshold voltage level prior to commencement of said active mode.

2. The system of claim 1, wherein said dynamic logic circuit is comprised of at least one MOSFET transistor having a threshold voltage and a body voltage, and wherein said threshold voltage is a function of said body voltage.

3. The system of claim 2, wherein said dynamic logic circuit is comprised of at least one N-type transistor.

4. The system of claim 3, wherein said switching device is coupled to said at least one N-type transistor.

5. The system of claim 1, wherein said dynamic logic circuit is manufactured utilizing silicon on insulator technology.

6. The system of claim 1, wherein said dynamic logic circuit further comprises a CMOS transistor configuration.

7. The system of claim 1 wherein said switching device is an N-type MOSFET ground switch.

8. The system of claim 1 wherein said input selection means includes multiplexing means.

9. The system of claim 8 wherein said multiplexing means comprises a two-input multiplexer receiving said clock input and said pre-clock input as inputs.

10. The system of claim 9 wherein said multiplexer includes an output signal coupled to said switching device and a controller for selectively replacing said clock input with said pre-clock input.

11. The system of claim 10 wherein said input selection means includes instruction means stored in signal bearing media for selectively replacing said clock input with said pre-clock input.

12. A system for initializing a dynamic SOI logic circuit prior to a transition of said dynamic SOI logic circuit from a passive mode to an active mode of operation, said system comprising:

a dynamic SOI logic circuit including a first dynamic logic gate, a second dynamic logic gate, and a latch for latching output from said first dynamic logic gate into said second dynamic logic gate, and wherein said first dynamic logic gate includes a first floating transistor body, and said second dynamic logic gate includes a second floating transistor body;

a first clock signal applied to said first dynamic logic gate and said latch during said active mode of operation;

a second clock signal applied to said second dynamic logic gate during said active mode of operation;

a first pre-clock signal for discharging said first floating transistor body, and a second pre-clock signal for discharging said second floating transistor body; and a controller for selectively replacing said first clock signal with said first pre-clock signal within said first dynamic logic gate and said second clock signal with said second pre-clock signal within said second dynamic logic gate prior to a transition of said dynamic SOI logic circuit from a passive mode of operation to an active mode of operation.

13. A method for initializing threshold voltages of a dynamic SOI circuit prior to a transition of said dynamic circuit from a passive mode to an active mode of operation, said dynamic SOI circuit having a clock input into a switching device from which a transistor body charge may accumulate during said passive mode of operation, said method comprising:

prior to a transition from said passive to said active mode of operation, selectively replacing said clock input with a pre-clock input within said switching device, such that said transistor body charge may adequately discharge, thereby initializing threshold voltages within said dynamic SOI circuit prior to commencement of said active mode of operation.

* * * * *